United States Patent [19]

Magill

[11] 4,246,642
[45] Jan. 20, 1981

[54] LEAKY DIGITAL INTEGRATOR

[75] Inventor: D. Thomas Magill, Palo Alto, Calif.

[73] Assignee: Ricoh Company, Ltd., Tokyo, Japan

[21] Appl. No.: 5,298

[22] Filed: Jan. 22, 1979

[51] Int. Cl.³ .......................... G06F 7/49; G06F 15/31
[52] U.S. Cl. .................................... 364/733; 364/724
[58] Field of Search .................. 364/724, 733; 333/18, 333/28 R, 166; 325/42, 473, 477

[56] References Cited

U.S. PATENT DOCUMENTS

| | | | |
|---|---|---|---|
| 3,633,105 | 4/1972 | Lender et al. | 364/724 X |
| 3,699,321 | 10/1972 | Gibson | 364/724 |
| 3,732,410 | 5/1973 | Mackechnie | 364/724 |
| 3,992,616 | 11/1976 | Acker | 364/724 |

Primary Examiner—Jerry Smith
Attorney, Agent, or Firm—Claude A. S. Hamrick

[57] ABSTRACT

A leaky digital integrator comprising an accumulator circuit including an adder having first and second adder input terminals and an adder output terminal, and a shift register coupling the adder output terminal back to the second adder input terminal and to an integrator output terminal; a ternary signal detection circuit coupled to the integrator output terminal and operative to develop one of three decay factor signals depending upon whether the integrator output signal level is above, equal to or below a predetermined reference level; and switching apparatus having a first switched terminal which is periodically coupled at a first rate to the first adder input terminal to input update data signals to the accumulator circuit and a second switched terminal which is periodically coupled at a second rate to the first adder input terminal to input decay data signals to the accumulator circuit such that the circuit as a whole performs according to the equation $$a_i(t) = Da_i(t-1) + \Delta a_i(t)$$

where $a_i(t)$ is the integrator output at time t, D is the decay factor and $\Delta a_i(t)$ is the update increment.

11 Claims, 7 Drawing Figures

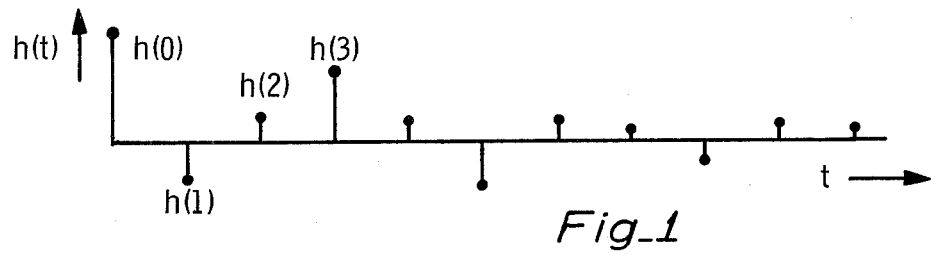
Fig_1
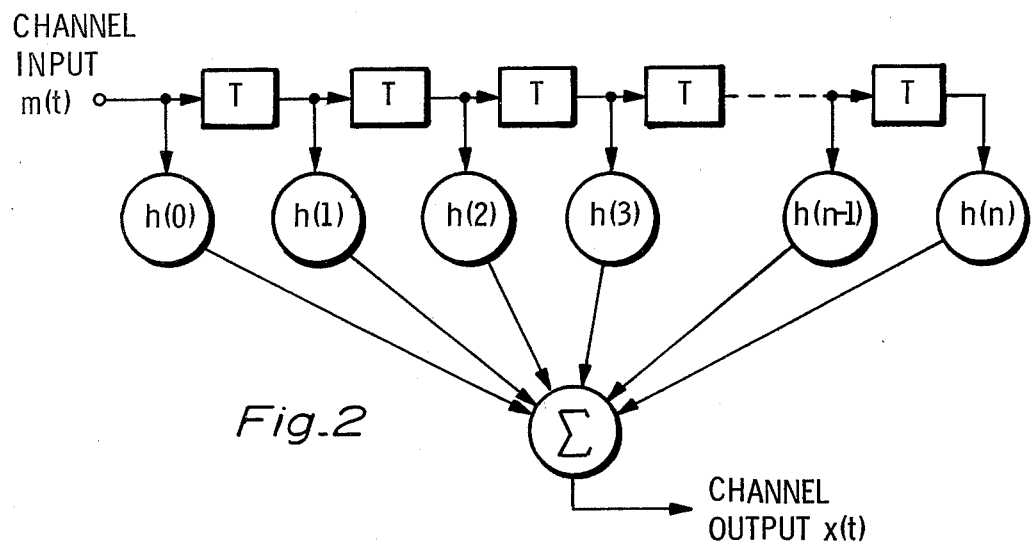
Fig_2
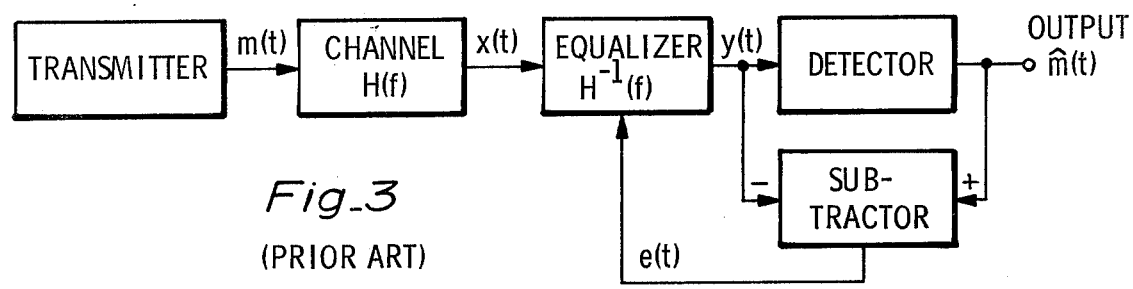
Fig_3
(PRIOR ART)
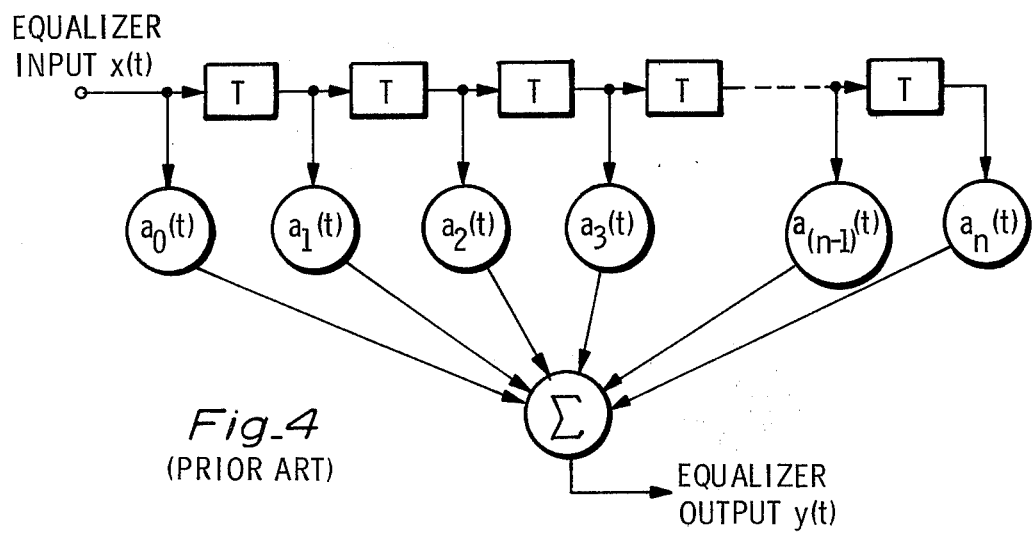
Fig_4
(PRIOR ART)

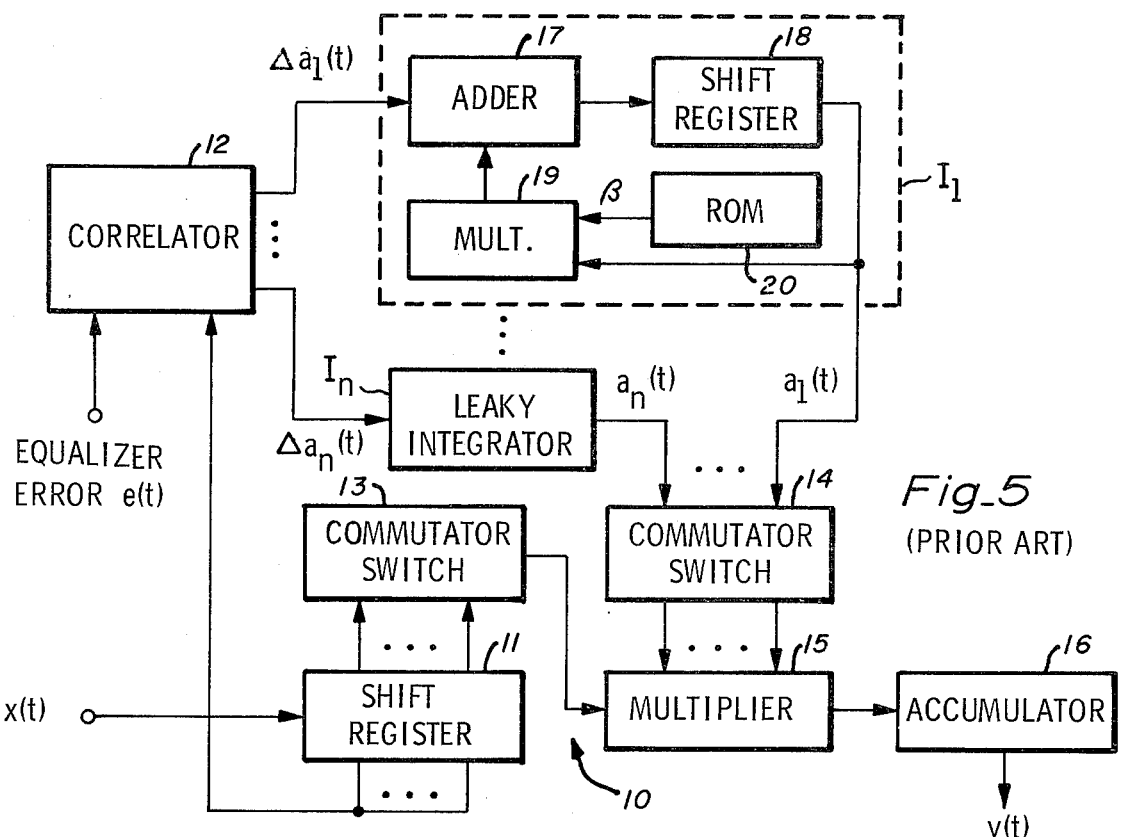
Fig_5 (PRIOR ART)
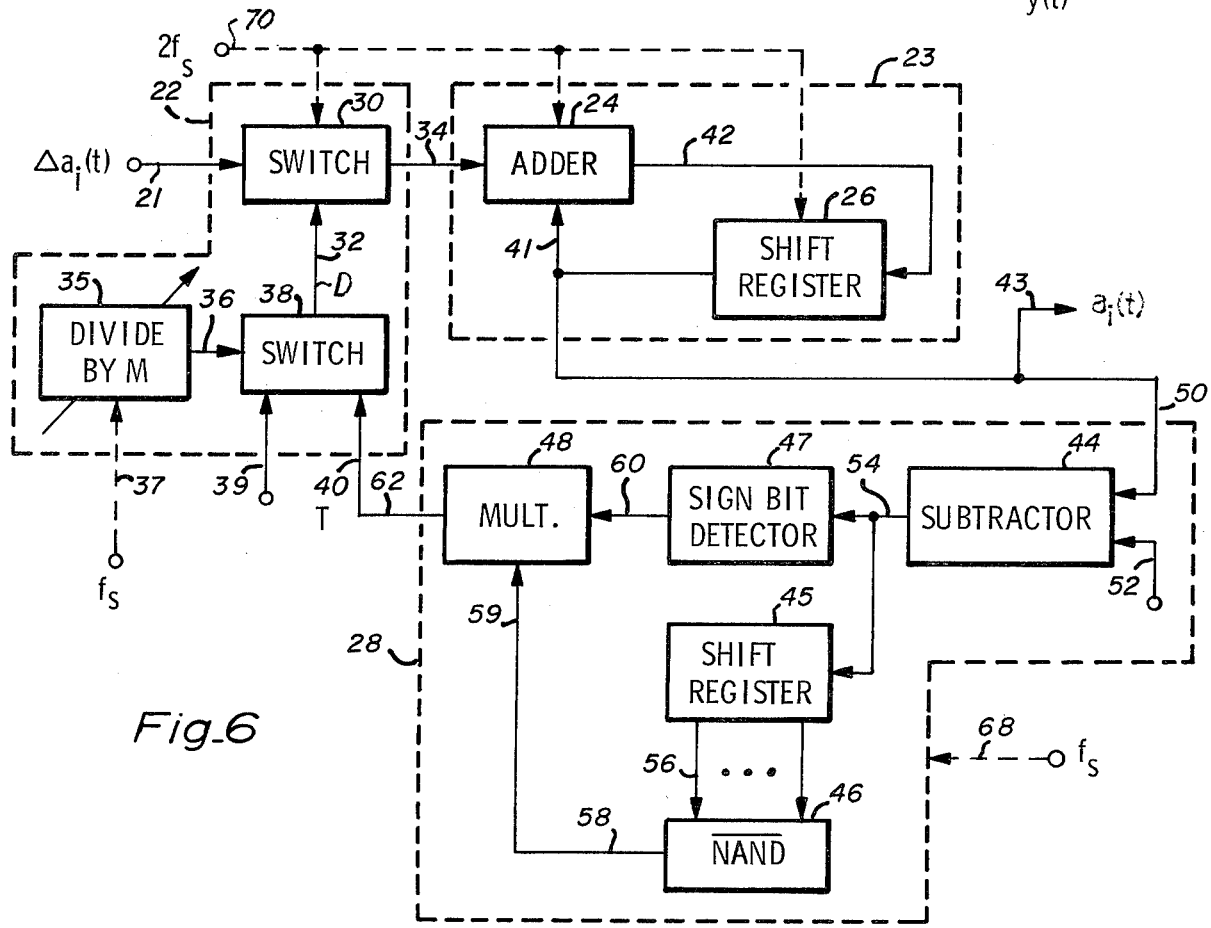
Fig_6

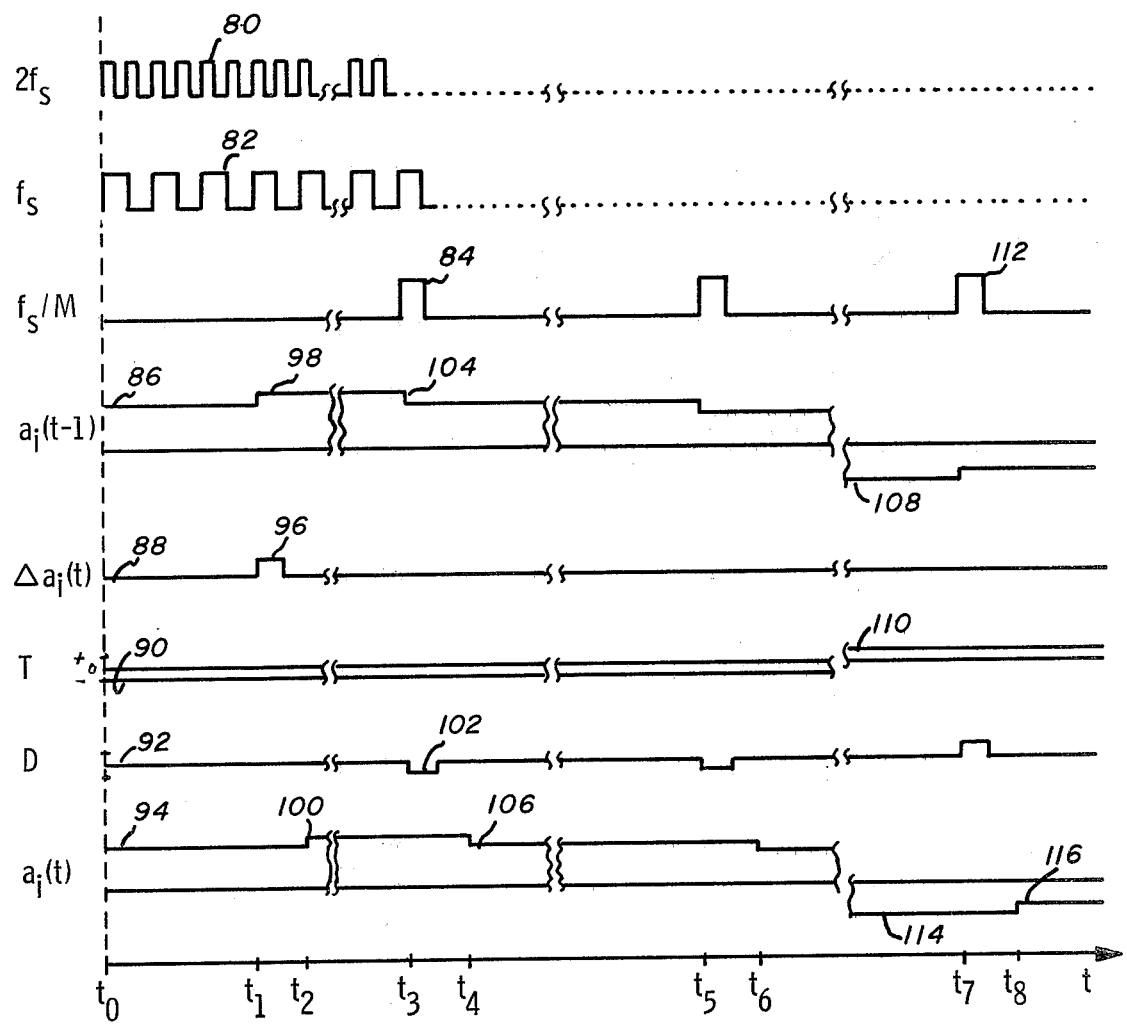
Fig_7

LEAKY DIGITAL INTEGRATOR

BACKGROUND OF THE INVENTION

1. Field of the Invention

The present invention relates generally to circuitry for use in the equalizer devices of digital communications systems, and more specifically to an adaptive leaky digital integrator circuit having particular application in the instability compensation network of an equalizer circuit of the type used in modem devices.

2. Description of the Prior Art

It is well known in communication technology that during transmission of digital data to a remote receiver, the transmitted signal often suffers amplitude and phase shift distortions that in many cases make the signal very difficult to decode after it has been received. In order to compensate for such nonlinearities caused by the transmission media, and particularly in systems in which the media is a telephone channel, it has become common practice to utilize equalizing circuitry in the receiver front end.

A typical band-limited telephone channel can be characterized by its transfer function H(f) which is the Fourier transform of the channel impulse response h(t). In FIG. 1 of the drawing, a typical impulse response (in discrete time) is illustrated which shows the substantial inter-symbol interference which can occur if an attempt is made to signal at a rate which is too high. In discrete time a telephone channel can be modeled by a feed-forward or transversal filter such as that shown in FIG. 2 of the drawing. Note that the tap values correspond to the impulse response at the corresponding delay values.

The harmful effects of inter-symbol interference can be removed however by processing the received signal using an adaptive equalizer having a transfer function $H^{-1}(f)$. Thus, the series combination of the transfer functions H(f) and $H^{-1}(f)$ is equivalent to multiplication by 1. That is, in the noise free case, the output of the equalizer is the same as the channel input, i.e., the transmitter output. FIG. 3 illustrates an overall system block diagram in which x(t) is the received signal and y(t) is the processed signal.

It may be shown that any equalizer transfer function can be realized by the linear transversal filter schematically illustrated in FIG. 4. In such circuit the equalizer output is given by $$y(t) = \sum_{i=1}^{N} a_i x(t - i)$$

where $a_i$ represents the tap coefficients of the transversal filter and x(t) is the channel output, i.e., the equalizer input. Note that it may be more computationally efficient to use feedback or partial feedback (and partial transversal) equalization. However, for the present explanatory purposes, it suffices to consider a transversal equalizer.

Designing an equalizer to produce the transfer function $H^{-1}(f)$ is an optimum strategy provided one knows H(f) and can compute $H^{-1}(f)$. Unfortunately, in practice H(f) is seldom known and in effect must be learned. However, rather than learning H(f) and computing $H^{-1}(f)$, it has been found that the least mean square (LMS) algorithm can be applied directly to computing the tap coefficients. The LMS algorithm states that at any time "t" the $i^{th}$ tap coefficient $a_i(t)$ can be related to its time predecessor $a_i(t-1)$ by the equation $$a_i(t) = a_i(t-1) + \Delta a_i(t)$$

where $\Delta a_i(t)$ is proportional to $$\sum_{n=-\infty}^{t} e(n)x(n - i).$$

In the above expression e(n) is the equalization signal which is given by $e(n) = \hat{m}(n) - y(n)$ and $\hat{m}(n)$ is the detector output signal. Thus, a simple cross correlation can be used to update the tap coefficients in such a fashion that the equalizer produces the inverse of the channel transfer function.

However, adaptive equalizers used in telephone line data modems can have stability problems in that for channels which are narrowband for the signaling rate, the equalizer tap coefficients may drift away from the optimum values. Note that if in the above equation $a_i(t-1)$ has an error, that error is also present in $a_i(t)$, $a_i(t-1)$, etc. That is, there is no mechanism for causing the error to be "forgotten." A reference to instability correction by G. Underboeck entitled "Fractional Tap-Spacing Equalizer and Cosequences for Clock Recovery in Data Modems," may be found in *IEEE Trans Communications*, Vo. COM-24, No. 8, pp. 856–864 (August 1976).

One method of combatting this problem is to replace the ideal integrator normally used in implementing the tap coefficient update algorithm stated above. More specifically, the update equation is modified by including a decay factor $\beta$ in the time predecessor component; that is, by making $$a_i(t) = \beta a_i(t-1) + \Delta a_i(t).$$

For reasonable performance, the parameter $\beta$ should be quite close to but less than 1; e.g., 0.999.

In FIG. 5 of the drawing, a prior art equalizer and its adaptive tap coefficient network is shown at 10 which includes a shift register 11, a correlator 12, commutator switches 13 and 14, a multiplier 15, an accumulator 16 and a plurality of leaky integrators $I_1$–$I_n$ provided in the tap coefficient update circuits. Note that as illustrated within the dashed lines, the integrator $I_1$, for example, includes an adder 17, a shift register 18, a multiplier 19 and a ROM 20. An update increment $\Delta a_i(t)$ is input to each integrator I from the correlator 12 and is added in adder 17 to the delayed coefficient $a_i(t-1)$ after it has been multiplied by a decay factor $\beta$ which is extracted from the ROM 20.

The difficulty with this theoretically sound approach for implementing a leaky integrator is that it requires one multiplication per tap coefficient per input sample processed by the equalizer. For many practical systems, this requires an excessive number of multiplications per second and thus an inordinant increase in the complexity and cost of the system.

Prior art references discussing leaky integrators are *Delta Modulator Systems* by R. Steele, Halsted Press, John Wiley & Sons (ISBN 0-470-82104-3), p. 304; *Linear Systems in Communication and Control* by D. K. Frederick and A. B. Carlson, John Wiley & Sons (ISBN 0-471-27721-5), p. 449; and *Digital Processing of Signals* by Gold and Rader, McGraw Hill, Library of Congress No. 69-13606, pp. 23–24.

SUMMARY OF THE PRESENT INVENTION

It is therefore a principal object of the present invention to provide a leaky, digital integrator circuit which does not require the inclusion of multi-digit multiplying components.

Another object of the present invention is to provide a novel decay control circuit for a leaky digital integrator.

Still another object of the present invention is to provide an instability compensation circuit for an equalizer device using relatively simple and inexpensive tap coefficient control circuit components.

Briefly, a preferred embodiment of a leaky integrator in accordance with the present invention comprises an accumulator circuit including an adder having first and second adder input terminals and an adder output terminal, and a shift register coupling the adder output terminal back to the second adder input terminal and to an integrator output terminal; a ternary operator circuit coupled to the integrator output terminal and operative to develop one of three decay factor signals depending upon whether the integrator output signal level is above, equal to, or below a predetermined reference level; and switching apparatus having a first switched terminal which is periodically coupled at a first rate to the first adder input terminal to input update data signals to the accumulator circuit and a second switched terminal which is periodically coupled at a second rate to the first adder input terminal to input decay data signals to the accumulator circuit such that the circuit as a whole performs according to the equation $$a_i(t) = D a_i(t-1) + \Delta a_i(t)$$

where $a_i(t)$ is the integrator output at time t, D is the decay factor and $\Delta a_i(t)$ is the update increment.

Among the advantages of the present invention is that it allows a leaky digital integrator to be implemented using relatively simple and inexpensive digital logic components.

Another advantage of the present invention is that it provides a leaky digital integrator circuit which does not require the use of multibit digital multiplication components.

These and other objects and advantages of the present invention will no doubt become apparent to those of ordinary skill in the art after having read the following detailed description of a preferred embodiment which is shown in the drawing.

IN THE DRAWING

FIG. 1 is a diagram illustrating a typical channel impulse response;

FIG. 2 is a block diagram illustrating a transversal filter model of a typical channel;

FIG. 3 is a functional block diagram illustrating a prior art communication system of the type in which the present invention might be included;

FIG. 4 is a diagram schematically illustrating a linear transversal filter that may be used for equalization;

FIG. 5 is a block diagram illustrating a conventional modem equalizer;

FIG. 6 is a block diagram illustrating the principal operative components of a leaky digital integrator circuit in accordance with the present invention; and FIG. 7 is a timing diagram illustrating operation of the integrator shown in FIG. 6.

DETAILED DESCRIPTION OF THE PREFERRED EMBODIMENT

Referring now to FIG. 6 of the drawing, there is shown a functional block diagram illustrating the principal operative components of a leaky digital integrator circuit of a type which can be directly substituted for the prior art leaky integrator circuit of a system such as that illustrated in FIG. 5. As depicted, the circuit includes an input terminal 21 for receiving an update increment $\Delta a_i(t)$, a switching circuit 22, an accumulator circuit including an adder 24 and a shift register 26, and a ternary operator circuit 28.

As illustrated, the switching circuit 22 includes a toggle switch 30 which couples either terminal 21 or line 32 to the input 34 of adder 24, an adjustable divider component 35 which develops a switch driving pulse on line 36 upon the occurrence of each $M^{th}$ clock pulse input at 37, and a second switch 38 which in response to the pulse input thereto on line 36 switches from a zero valued input 39 to a ternary signal input 40 so as to develop a decay pulse D on line 32.

Adder 24 of accumulator 23 sums the signal input to it at inputs 34 and 41, and develops a summation signal on line 42 which is in turn input to shift register 26 wherein it is delayed for a unit period of time and the delayed signal, typically a 16 bit digital word, is then coupled back to adder input 41 as well as to the integrator output terminal 43. Briefly stated, the function of accumulator 23 is to accumulate all signals input thereto on line 34 and to make the accumulated signal available at output terminal 43.

The ternary operator circuit 28 includes a subtractor circuit 44, a shift register 45, a complemented NAND circuit 46, a sign bit detector 47, and a single-bit-per-input multiplier 48. The purpose of this circuit is to provide a correction decay every $m^{th}$ sample of $a_i(t)$ which will tend to return $a_i(t)$ towards zero if $a_i(t)$ is not equal to zero, but to provide no correction decay if $a_i(t)$ is equal to zero. More specifically, if the 16 bit digital word representing $a_i(t)$ is greater than zero, i.e., is positive, then the signal T developed at the output of circuit 28, i.e., on line 62, will be $-1$. On the other hand, if $a_i(t)$ is less than zero, i.e., is negative, then the signal T developed on line 62 will be $+1$. If $a_i(t)$ is equal to zero, i.e., is comprised of a series of 16 zero bits, the signal developed on line 62 will be zero. Subtractor 44 has a first input 50 coupled to output terminal 43 and a second input 52 coupled to a zero reference source and develops at its output 54 a difference signal in the form of a digital word which is positive if line 50 is negative and is negative if line 50 is positive, and thereby indicates whether the tap coefficient signal level appearing at output terminal 43 is above or below the zero reference level. Shift register 45 converts the 16 bit digital word representing $-a_i(t)$, i.e., the output of subtractor 44, into a parallel word that is more convenient for processing by the complemented NAND circuit 46. The difference signal developed at 54 is input to both detector 47 and the series-to-parallel shift register 45. The several parallel outputs 56 of register 45 are coupled into the complemented NAND circuit 46 which develops a 0 voltage on line 58 if all signals input on lines 56 are zero. In the event that any line 56 carries a logical 1, then the output developed on line 58 will be a $+1$ voltage. The output of circuit 46 is fed into a first input terminal 59 of the multiplier 48.

The sign bit detector 47 detects the sign of the signal appearing on line 54 and develops a +1 at its output 60 if the signal is positive and a −1 if the signal is negative. Multiplier 48 multiplies the signals on its input lines 59 and 60 and develops a ternary output signal T at terminal 62 which will be in the form of either +1, 0 or −1 depending upon the sign of the input at 60 and the state of the input at 59. It will be noted that the ternary circuit 28 is clocked at the sampling frequency $f_s$ by a clock signal input at 68, switch 38 is clocked at the frequency $f_s/M$ by the signal input at 36, and switch 30, adder 24 and shift register 26 are all clocked at frequency $2f_s$ by a signal input at 70. Note also that by adjusting the value of M in the divider 35, the time constant of the integrator can be varied.

Referring now additionally to FIG. 7 of the drawing, operation of the circuit will be described relative to the clock signals $f_s$, $2f_s$ and $f_s/M$ illustrated at 80, 82 and 84 respectively. Assuming that at a time $t_0$ the predecessor tap coefficient $a_i(t-1)$, the update increment $\Delta a_i(t)$, the ternary circuit output T, the decay increment D and the tap coefficient $a_i(t)$ are at the values indicated at 86, 88, 90, 92 and 94, it will be appreciated that if at time $t_1$ an update increment $\Delta a_i(t)$ such as is illustrated at 96 is input at terminal 21, switch 22 will cause the increment to be input to adder 24 for addition to the tap coefficient signal $a_i(t)$ appearing on line 41 and the value of $a_i(t-1)$ appearing on line 42 as indicated at 98. During the following unit of time, this value will be shifted through register 26 and at time $t_2$, $a_i(t)$ will be increased as indicated at 100.

In the meantime, ternary circuit 28 has been comparing the tap coefficient at output 43 to a zero reference level input at 52, and has determined that the coefficient is positive with respect to the reference level. It therefore has generated a negative output signal T on line 62 as indicated at 90. Accordingly, upon the occurrence of the pulse 84, switch 38 will switch from the zero valued terminal 39 to terminal 40 and output a negative-going decay pulse D on line 32 as indicated at 102. Upon occurrence of the next pulse input at terminal 70, switch 30 will switch from input 21 to input 32 and cause the decay pulse 102 to be input to adder 24 for addition to the output of shift register 26, and as a result, $a_i(t-1)$ will be decremented by a small amount as indicated at 104. The decremented signals will then be shifted through register 26 until at time $t_4$ the tap coefficient signal $a_i(t)$ appearing at output terminal 43 will also be decremented as illustrated at 106.

This process will continue, and the tap coefficient will be caused to decrement following every $f_s/M$th clock pulse, until the value of the tap coefficient $a_i(t)$ reaches zero, at which time the ternary output T will also be zero and the decrementing operation will cease. However, should the tap coefficient thereafter be changed to a negative level by a negative update increment input at terminal 21, as indicated at 108, then ternary circuit 28 will generate a positive decay factor T as indicated at 110, and as a result, following the occurrence of clock pulse 112 and a subsequent unit time delay, the negative tap coefficient, as illustrated at 114, will be incremented as indicated at 116, etc.

It will thus be appreciated that such a circuit provides the full equivalent of a leaky integrator which performs according to the algorithm $$a_i(t)=Da_i(t-1)+\Delta a_i(t).$$

Moreover, the circuit is adaptive in nature and avoids the necessity of performing multiple bit digital multiplication. As a result, substantial savings can be obtained in the tap coefficient control circuitry of an equalizer of the type illustrated in FIG. 5. It will of course also be appreciated that the adaptive circuit described hereinabove is not limited to use in equalizer circuitry and in fact will find potential application in circuitry requiring adaptive digital integration.

Furthermore, it is to be understood that even though a preferred embodiment has been described in terms of a schematic diagram, the present invention could be implemented using various alternative methods and circuit arrangements. It is therefore intended that the appended claims cover all such alternatives as fall within the true spirit and scope of the invention.

What is claimed is:

1. An adaptive leaky integrator circuit comprising:
   accumulator means including an adder having first and second adder input terminals and an adder output terminal, and a shift register coupling the adder output terminal back to the second adder input terminal and to an integrator output terminal;
   ternary operator means coupled to said integrator output terminal and operative to develop one of three decay factor signals depending upon whether the integrator output signal level is above, equal to, or below a predetermined reference level; and
   switching means having a first switched terminal which is periodically coupled at a first rate to the first adder input terminal to input update data signals to the accumulator circuit, and a second switched terminal which is periodically coupled at a second rate to the first adder input terminal to input decay data signals to the accumulator circuit such that the circuit as a whole performs according to the equation $$a_i(t)=Da_i(t-1)+\Delta a_i(t)$$

where $a_i(t)$ is the integrator output at time t, D is the decay factor and $\Delta a_i(t)$ is the update increment.

2. An adaptive integrator circuit as recited in claim 1 wherein said ternary operator means causes said decay signal to have a negative predetermined value if said integrator output signal is above said reference level, causes said decay signal to be of zero value if said integrator output signal is substantially equal to said reference level, and causes said decay signal to have a positive predetermined value if said integrator output signal is below said reference level.

3. An adaptive leaky integrator circuit as recited in claim 1 wherein said ternary operator means includes means for determining the difference between said integrator output signal and said predetermined reference level and for developing a difference signal commensurate therewith, means for determining whether said difference signal is positive or negative and for developing a sign signal commensurate therewith, means for determining whether said difference signal is equal to zero or is different from zero and for developing a data signal commensurate therewith, and multiplier means for multiplying said data signal by said sign signal to develop said decay signal.

4. An adaptive leaky integrator circuit as recited in claim 1 wherein said switching means includes a first switching element which alternately couples said first adder input terminal to said first switched terminal and a second switched terminal, and a second switching element which normally couples said first adder input terminal to a third switched terminal for receiving a zero value signal but periodically couples said first adder input terminal to a fourth switched terminal for receiving said decay signal.

5. An adaptive leaky integrator circuit as recited in claim 4 wherein said second switching element couples said fourth switched terminal to said first adder input terminal through said second switched terminal.

6. An adaptive leaky integrator circuit comprising:
adder means having first and second input terminals and operative to add digital signals input thereto to develop a summation signal;
switching means having third and fourth input terminals and operative to periodically couple each of said third and fourth input terminals to said first input terminal;
output terminal means;
signal delay means for delaying said summation signal and for coupling the delayed summation signal to said second input terminal and to said output terminal means; and
signal monitoring means for monitoring the signal level at said output terminal means and for determining whether or not the level of said delayed summation signal is above or below a predetermined reference level, for developing a decay signal commensurate therewith and for coupling said decay signal to said fourth input terminal so that it may be input by said switching means to said adder means wherein said delayed summation signal approximates the integral of update signals applied to said third input terminal modified by a slight decay factor as determined by said decay signal.

7. An adaptive leaky integrator circuit as recited in claim 6 wherein said signal monitoring means is a ternary operator circuit which causes said decay signal to have a negative predetermined value if said delayed summation signal is above said reference level, causes said decay signal to be of zero value if said delayed summation signal is substantially equal to said reference level, and causes said decay signal to have a positive predetermined value if said delayed summation signal is beneath said reference level.

8. An adaptive leaky integrator circuit as recited in claim 6 wherein said switching means includes a first switching element which alternately couples said first input terminal to said third input terminal and a fifth input terminal, and a second switching element which normally couples said fifth input terminal to a sixth input terminal for receiving a zero value signal but periodically couples said fifth input terminal to said fourth input terminal.

9. An adaptive leaky integrator circuit as recited in claim 8 wherein said switching means further includes means for controlling the switching period of said second switching element such that it controls the effective time constant of the integrator circuit.

10. An adaptive leaky integrator circuit as recited in claim 6 wherein said signal monitoring means includes means for determining the difference between said delayed summation signal and said predetermined reference level and for developing a difference signal commensurate therewith, means for determining whether said difference signal is positive or negative and for developing a sign signal commensurate therewith, means for determining whether said difference signal is equal to zero or is different from zero and for developing a difference determining signal commensurate therewith, and multiplier means for multiplying said determining signal by said sign signal to develop said decay signal.

11. In an equalizer means having a plurality of taps, means for correlating the taps with an input signal and for developing tap update signals commensurate therewith, and leaky integrator means for integrating each of said update signals and for developing tap coefficient signals for modifying the output of the equalizer, an improved leaky integrator circuit comprising:
accumulator means for accumulating update signals and for developing a tap coefficient signal;
means for alternately and periodically coupling said update signals into said accumulator means and for similarly coupling one of a plurality of predetermined decay signals into said accumulator means so as to cause said tap coefficient to decay toward a predetermined reference value; and
means for monitoring said tap coefficient signal, for determining which of said plurality of predetermined decay signals is to be developed, and for developing the particular decay signal to be input to accumulator means.

* * * * *